United States Patent
Hiramatsu

(10) Patent No.: US 8,584,859 B2
(45) Date of Patent: Nov. 19, 2013

(54) COVER TAPE FOR PACKAGING ELECTRONIC PART AND ELECTRONIC PART PACKAGE

(75) Inventor: Masayuki Hiramatsu, Tokyo (JP)

(73) Assignee: Sumitomo Bakelite Co., Ltd, Tokyo (JP)

( * ) Notice: Subject to any disclaimer, the term of this patent is extended or adjusted under 35 U.S.C. 154(b) by 0 days.

(21) Appl. No.: 13/386,081

(22) PCT Filed: Jul. 21, 2010

(86) PCT No.: PCT/JP2010/004661
§ 371 (c)(1),
(2), (4) Date: Jan. 20, 2012

(87) PCT Pub. No.: WO2011/010453
PCT Pub. Date: Jan. 27, 2011

(65) Prior Publication Data
US 2012/0118789 A1    May 17, 2012

(30) Foreign Application Priority Data

Jul. 22, 2009 (JP) .................. 2009-171516
Mar. 31, 2010 (JP) .................. 2010-081115

(51) Int. Cl.
*B65D 73/02* (2006.01)

(52) U.S. Cl.
USPC ......... 206/714; 206/713; 428/354; 428/355 R

(58) Field of Classification Search
USPC .............. 206/484, 484.2, 713, 714, 717, 725; 428/35.4, 35.7, 335–355 EN, 355 R
See application file for complete search history.

(56) References Cited

U.S. PATENT DOCUMENTS

| | | | | |
|---|---|---|---|---|
| 5,208,103 A * | 5/1993 | Miyamoto et al. | ............ | 428/354 |
| 5,447,784 A * | 9/1995 | Williams et al. | ............ | 428/354 |
| 5,491,013 A * | 2/1996 | Holley | ............ | 428/354 |
| 5,599,621 A * | 2/1997 | Akhter | ............ | 428/349 |
| 5,691,038 A * | 11/1997 | Hirata et al. | ............ | 428/354 |
| 5,846,652 A * | 12/1998 | Yamashita | ............ | 428/349 |
| 6,027,802 A * | 2/2000 | Lin | ............ | 428/343 |
| 6,030,692 A * | 2/2000 | Auger | ............ | 428/354 |
| 6,787,224 B2 * | 9/2004 | Nakanishi et al. | ............ | 428/335 |
| 2005/0014892 A1 * | 1/2005 | Hayashi | ............ | 428/343 |

FOREIGN PATENT DOCUMENTS

| | | |
|---|---|---|
| JP | 2007-331783 | 12/2007 |
| JP | 2008-214583 | 9/2008 |
| JP | 2009-035659 | 2/2009 |

OTHER PUBLICATIONS

International Search Report for International Application No. PCT/JP2010/004661 mailed on Oct. 26, 2010.

* cited by examiner

*Primary Examiner* — Luan K Bui
(74) *Attorney, Agent, or Firm* — Turocy & Watson, LLP

(57) ABSTRACT

The object of the present invention is to provide a cover tape for electronic part packaging that is more difficult to take on electrostatic charge and has excellent transparency, and to provide a package for an electronic part. A cover tape (100) relating to the present invention includes a plurality of layers including at least a base layer (110) and a heat seal layer (140). At least two layers of these plurality of layers are laminated with an adhesive layer (120) interposed. The adhesive layer (120) contains an antistatic agent in an amount that makes up 10 wt % or more and 70 wt % or less of the adhesive layer (120). The antistatic agent contains an alkylene carbonate and a surfactant as the primary components.

18 Claims, 4 Drawing Sheets

COVER TAPE FOR PACKAGING ELECTRONIC PART AND ELECTRONIC PART PACKAGE

TECHNICAL FIELD

The present invention relates to a cover tape for packaging an electronic part and to an electronic part package

BACKGROUND ART

In the surface mount field, surface mount electronic components (referred to below as electronic parts) including ICs (integrated circuits), transistor, diodes, condensers, piezoelectric resistors and the like are supplied after being packaged in electronic part packages derived from carrier tape and cover tape that is heat-sealed to the carrier tape, and after the electronic part packages have been wound onto a reel. When the packaged electronic parts in electronic part packages are surface-mounted onto an electronic circuit board, the cover tape is delaminated from the electronic part package that has been unwound from a reel, and the electronic part is removed from a pocket in the carrier tape.

At the same time, during transport of the electronic part that is packaged in an electronic part package, static electricity is generated through friction between the cover tape and the electronic part, which gives the cover tape a static charge. Moreover, static electricity is generated when the cover tape is delaminated from the carrier tape, which gives the cover tape a static charge. Recently, along with the miniaturization and high functionalization of electronic devices, there is rapid progress wherein electronic parts for mounting in electronic devices are being miniaturized and made lighter in weight. When such miniaturized and light-weight electronic parts are stuck to cover tape bearing a static charge, there are concerns that process troubles can occur, such as pick-up defects. Moreover, there are concerns that the electronic parts might be damaged due to electrostatic discharge from the electrically charged cover tape.

To counteract problems generated by such electrically charged cover tapes, for example, a top tape (corresponding to a cover tape) was disclosed in Patent Document 1, equipped with a surface layer, an intermediate layer having an antistatic function, a heat-sealing material layer, and an adhesive layer. The adhesive layer contains a conductive substance to prevent a static electric charge, and adheres to the surface layer and intermediate layer. For this conductive substance, metals are used such as tin oxide, gold, silver, copper, iron, nickel, or zinc, or carbon materials such as Ketjen Black or acetylene black.

PRIOR ART LITERATURE

Patent Literature

Patent Document 1: Japanese Published Unexamined Patent Application No. 2000-142786

SUMMARY OF THE INVENTION

Problem to be Solved by the Invention

As mentioned above, when a metal or carbon material is added to an adhesive layer, the conductivity of the top tape is increased and it is more difficult for the top tape to become electrically charged, but on the other hand the transparency of the top tape is decreased. For this reason, when a metal or carbon material is added to the adhesive layer, it becomes difficult for electronic part that is packaged in the package to be seen by the user through the top tape.

The object of the present invention is to provide a cover tape for packaging electronic parts for which taking on electrostatic charge is more difficult and which has excellent transparency, and further provided is a package for an electronic part.

Means to Solve the Problem (1)

A cover tape for packaging electronic parts in an aspect of the present invention includes a plurality of layers including at least a base layer and a heat seal layer. At least two layers of this plurality of layers are laminated with an adhesive layer interposed. The adhesive layer contains an antistatic agent in an amount that makes up 10 wt % or more and 70 wt % or less of the adhesive layer. The antistatic agent contains an alkylene carbonate and a surfactant as the primary components.

As the result of diligently conducted research by the present inventors, it became clear that by adding an antistatic agent to the adhesive layer to make up 10 wt % or more and 70 wt % or less of said adhesive layer, it will be more difficult for the cover tape for packaging an electronic part to become electrically charged. For this reason, the cover tape for packaging an electronic part can prevent pick-up defects in electronic parts, and can prevent damage to electronic parts due to electrostatic discharge.

Furthermore, the antistatic agent has an alkylene carbonate and a surfactant as the main components, and contains no or essentially no conductive substances such as metal or carbon materials that are factors that decrease the transparency of the cover tape for packaging electronic parts. Therefore, the cover tape for packaging electronic parts has superior transparency.

Consequently, it will be more difficult for the cover tape for packaging electronic parts to become electrically charged, and it will have superior transparency.

(2)

In the cover tape for packaging electronic parts mentioned in (1) above, the adhesive layer contains an antistatic agent in an amount that makes up 45 wt % or more and 70 wt % or less of the adhesive layer.

As the result of diligently conducted research by the present inventors, it became clear that by adding an antistatic agent to the adhesive layer to make up 45 wt % or more and 70 wt % or less of the adhesive layer, it will be more difficult for the cover tape for packaging an electronic part to become electrically charged. For this reason, the cover tape for packaging an electronic part can prevent pick-up defects in electronic parts, and can prevent damage to electronic parts due to electrostatic discharge.

(3)

In the cover tape for packaging electronic parts mentioned in (1) or (2) above, the plurality of layers includes a cushion layer. This cushion layer is provided between a base layer and a heat seal layer.

When the cover tape for packaging electronic parts is heat-sealed onto the carrier tape for packaging electronic parts, the cushion layer plays a cushioning role to apply heat and pressure uniformly to the cover tape for packaging electronic parts and the carrier tape for packaging electronic parts. In this way, the cover tape for packaging electronic parts can be reliably heat-sealed to the carrier tape for packaging electronic parts.

(4)

In the cover tape for packaging electronic parts mentioned in (3) above, an adhesive layer is interposed between the base layer and the cushion layer and they are laminated.

Since it is easy to provide an adhesive layer between the base layer and the cushion layer, it is not necessary to provide additional adhesive layers between other the layers. For this reason, the manufacturing costs of the cover tape for packaging electronic parts can be reduced.

(5)

In any of the cover tapes for packaging electronic parts mentioned in (1) through (4) above, the surfactant can be an ionic surfactant.

A surfactant that is an ionic surfactant has excellent ionic conductivity. For this reason, it will be more difficult for the cover tape for packaging electronic parts to become electrically charged.

(6)

In the cover tape for packaging electronic parts mentioned in (5) above, the ionic surfactant is a cationic surfactant.

An ionic surfactant that is a cationic surfactant dissolves readily in alkylene carbonate. The alkylene carbonate solution of the cationic surfactant is transparent. For this reason, the cover tape for packaging electronic parts has superior transparency. Furthermore, it will be more difficult for the cover tape for packaging electronic parts to become electrically charged. Moreover, since an inexpensive cationic surfactant is used, the manufacturing costs of the cover tape for packaging electronic parts can be reduced.

(7)

In the cover tape for packaging electronic parts mentioned in (6) above, the cationic surfactant is an alkyl quaternary ammonium ethosulfate.

The cationic surfactant is an alkyl quaternary ammonium ethosulfate. For this reason, it will be more difficult for the cover tape for packaging electronic parts to become electrically charged.

(8)

In any of the cover tapes for packaging electronic parts mentioned in (1) through (7) above, the alkylene carbonate is propylene carbonate.

As the result of diligently conducted research by the present inventors, it became clear that by using propylene carbonate as the alkylene carbonate, it will be more difficult for the cover tape for packaging electronic parts to become electrically charged. For this reason, the cover tape for packaging electronic parts can prevent pick-up defects in electronic parts, and can prevent damage to electronic parts due to electrostatic discharge.

(9)

In any of the cover tapes for packaging electronic parts mentioned in (1) through (8) above, the weight ratio of the alkylene carbonate and surfactant (alkylene carbonate/surfactant) is 10/90 or more and 40/60 or less.

In the cover tape for packaging electronic parts mentioned, the weight ratio of the alkylene carbonate and surfactant (alkylene carbonate/surfactant) is 10/90 or more and 40/60 or less. For this reason, the surfactant is present in the dissolved state in the alkylene carbonate. When the weight ratio of the alkylene carbonate and surfactant is less than 10/90, the adhesive layer will have inadequate adhesive strength. When the weight ratio of the alkylene carbonate and surfactant exceeds 40/60, the surfactant will be an inadequate medium for preventing electrostatic charge, which will decrease the electrostatic charge prevention effect of the cover tape for packaging electronic parts. Consequently, if the weight ratio of the alkylene carbonate and surfactant (alkylene carbonate/surfactant) is within the range specified above, along with the adhesive layer having adhesiveness it will be more difficult for it to become electrically charged.

(10)

In any of the cover tapes for packaging electronic parts mentioned (1) through (9) above, the surface resistivity (measurement method: JIS K 6911) of the adhesive layer at 20% relative humidity (RH) is $10^8$ Ω/square or greater and $10^{12}$ Ω/square or less.

In this cover tapes for packaging electronic parts, the surface resistivity of the adhesive layer is $10^8$ Ω/square or greater and $10^{12}$ Ω/square or less. For this reason, the cover tapes for packaging electronic parts have high electrical conductivity at low humidity compared to conventional cover tapes for packaging electronic parts. Consequently, it is more difficult for the cover tape for packaging electronic parts to become electrically charged at low humidity.

(11)

In any of the cover tapes for packaging electronic parts mentioned (1) through (10) above, under conditions where no antistatic treatment has been applied to either side, when the surface of the side that has been heat-sealed is charged by the application of 5 kV, the decay time until the static voltage drops to 1% is 10 seconds or less.

This cover tape for packaging electronic parts can cause the static voltage to decay over a short period of time. For this reason, it is more difficult for the cover tape for packaging electronic parts to become electrically charged.

(12)

In any of the cover tapes for packaging electronic parts mentioned (1) through (11) above, under conditions where no antistatic treatment has been applied to either side, when there is friction for 1 minute between the surface of the side that has been heat-sealed and an electronic part at a speed of 300 rpm, the absolute value of the static voltage associated with the surface of the heat-sealed side of the cover tape for packaging electronic parts is 50 V or less.

Compared to conventional cover tapes for packaging electronic parts, this cover tape for packaging electronic parts can reduce the static voltage generated when there is friction with an electronic part. Consequently, it is more difficult for the cover tape for packaging electronic parts to become electrically charged.

(13)

In any of the cover tapes for packaging electronic parts mentioned (1) through (12) above, an antistatic treatment is applied to both surfaces or one surface.

It is more difficult for this cover tape for packaging electronic parts to become electrically charged because an antistatic treatment is applied to both surfaces or one surface.

(14)

In any of the cover tapes for packaging electronic parts mentioned (1) through (13) above, the adhesive layer can contain an adhesive resin. The antistatic agent is dissolved in the adhesive resin.

Usually, if the antistatic agent is not dissolved and rises to the surface, the adhesive strength of the adhesive layer will be diminished. However, in this cover tape for packaging electronic parts, an antistatic agent having no adhesive capability is present in the dissolved state in an adhesive resin. Consequently, the adhesive layer has superior adhesive strength.

(15)

In any of the cover tapes for packaging electronic parts mentioned (1) through (14) above, the base layer comprises a uniaxially- or biaxially-oriented film.

In this cover tape for packaging electronic parts, the base layer comprises a uniaxially- or biaxially-oriented film. For this reason, this base layer can give the cover tapes for packaging electronic parts greater mechanical strength compared to base layers that comprise a non-oriented film.

(16)

In any of the cover tapes for packaging electronic parts mentioned (1) through (15) above, the thickness of the base layer is 12 μm or more and 30 μm or less.

In the cover tape for packaging electronic parts, the thickness of the base layer is 12 μm or more and 30 μm or less. For this reason, the cover tape for packaging electronic parts will have satisfactory rigidity. Consequently, when a twisting stress is applied to the carrier tape for packaging electronic parts after heat-sealing, the cover tape for packaging electronic parts can conform to the deformations of the carrier tape for packaging electronic parts, and is readily delaminated from the carrier tape for packaging electronic parts and can prevent the loss of the electronic part from the electronic part package. Furthermore, the cover tape for packaging electronic parts has satisfactory mechanical strength. For this reason, the cover tape for packaging electronic parts can resist rupture when rapidly delaminated from the carrier tape for packaging electronic parts.

(17)

The package for electronic parts in an aspect of the present invention includes a cover tape for packaging electronic parts mentioned in (1) through (16) above and a carrier tape for packaging electronic parts to which the cover tape for packaging electronic parts is heat-sealed.

This electronic part package is provided with the above-mentioned cover tape for packaging electronic parts. For this reason, the package for electronic parts can prevent pick-up defects in the electronic part, and can prevent damage to electronic parts due to electrostatic discharge. Furthermore, the electronic part package has superior transparency.

(18)

In the package for electronic parts mentioned in (17) above, under conditions where no antistatic treatment has been applied to either side of the cover tape for packaging electronic parts, when the cover tape for packaging electronic parts is delaminated from the carrier tape for packaging electronic parts at a peel rate of 300 mm/min (test conditions: JIS C0806-3 standard), the absolute value of the electrostatic voltage generated on the surface of the heat-sealed side of the cover tape for packaging electronic parts is 150 V or less.

Compared to conventional packages for electronic parts, the electrostatic voltage generated when the cover tape for packaging electronic parts is delaminated from the carrier tape for packaging electronic parts is lower for these packages for electronic parts. For this reason, the cover tape for packaging electronic parts is better at preventing electrostatic charge.

(19)

The cover tape for packaging electronic parts in another aspect of the present invention includes a plurality of layers and an adhesive layer. The plurality of layers includes at least a base layer and a heat-sealing layer. The adhesive layer is adhered to at least any two of the plurality of layers. Moreover, the adhesive layer contains an antistatic agent in an amount that makes up 10 wt % or more and 70 wt % or less of the adhesive layer. The antistatic agent contains an alkylene carbonate and a surfactant as the primary components.

As the result of diligently conducted research by the present inventors, it became clear that adding an antistatic agent to the adhesive layer in an amount that makes up 10 wt % or more and 70 wt % or less of the adhesive layer makes it more difficult for the cover tape for packaging an electronic part to become electrically charged. For this reason, the cover tape for packaging an electronic product can prevent pick-up defects, and can prevent damage to electronic products due to electrostatic discharge.

Furthermore, the antistatic agent has an alkylene carbonate and a surfactant as the main components, and contains no or essentially no conductive substances such as metal or carbon materials that are factors that decrease the transparency of the cover tape for packaging electronic parts. Therefore, the cover tape for packaging electronic parts has superior transparency.

Effect of the Invention

It is more difficult for the cover tape for packaging electronic parts and the electronic parts package relating to the present invention to become electrically charged, and they have superior transparency.

BRIEF EXPLANATION OF DIAGRAMS

EXPLANATION OF SYMBOLS

Figure 1:
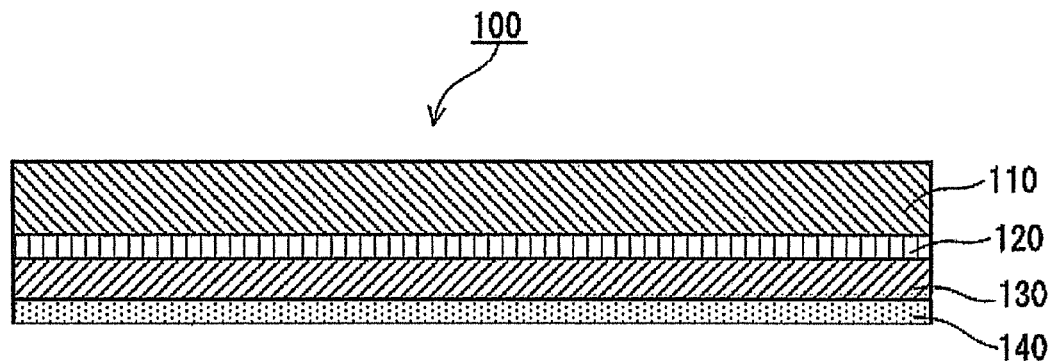
FIG. 1 is a cross-sectional diagram of a cover tape for packaging electronic parts relating to one embodiment of the present invention.

100 Cover tape (cover tape for packaging electronic parts)
110 Base layer
120 Adhesive layer
121 Antistatic agent
130 Cushion layer
140 Heat-sealing layer
200 Electronic parts package
300 Carrier tape (carrier tape for packaging electronic parts)

PREFERRED EMBODIMENT OF THE PRESENT INVENTION

Figure 2:
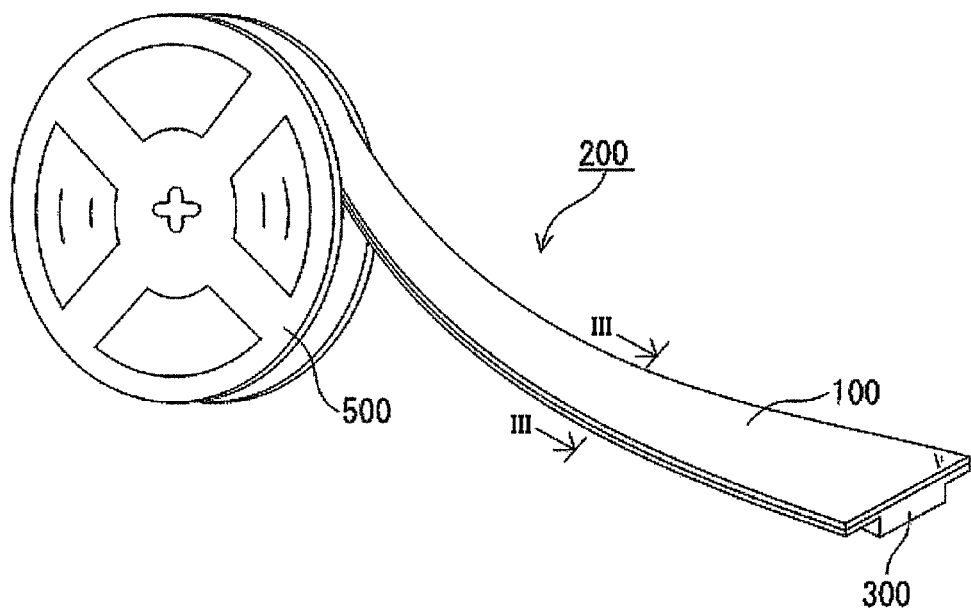
FIG. 2 is a perspective diagram of the electronic parts package provided with a cover tape for packaging electronic parts.
Figure 3:
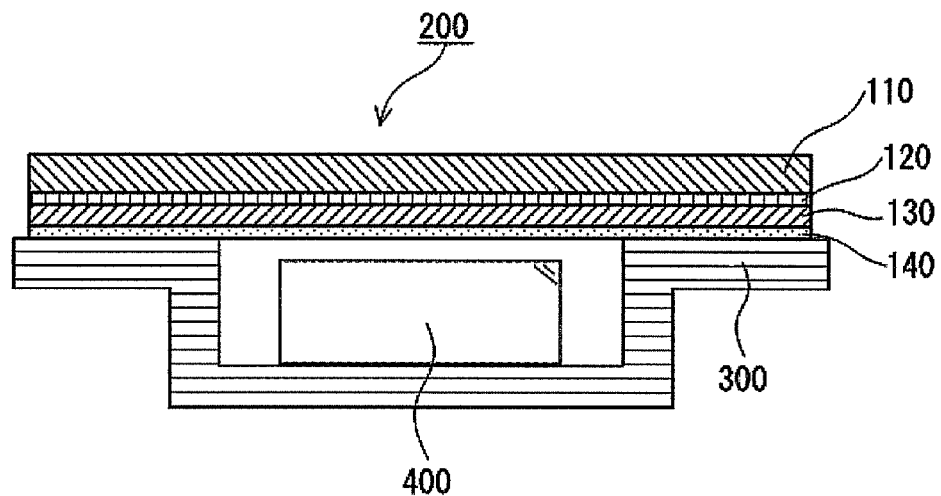
FIG. 3 is a cross-sectional diagram along the line A-A of the electronic parts package shown in FIG. 2.

As shown in FIG. 1, cover tape for packaging electronic parts 100 (referred to below as "cover tape") relating to the present embodiment is formed by the lamination in this order of base layer 110, adhesive layer 120, cushion layer 130, and heat-sealing layer 140. As shown in FIGS. 2 and 3, this cover tape 100 is heat-sealed to carrier tape for packaging electronic parts 300 (referred to below as "carrier tape") to construct a portion of electronic parts package 200. Each constituent of cover layer 100 is explained in detail below.

<Base Layer>

If base layer 110 is a film that has mechanical strength to withstand external forces applied, such as during tape processing and heat-sealing to the carrier tape, and has heat resistance to withstand heat-sealing, a film processed from suitable types of materials according to the application can be used. Specifically, poly(ethylene terephthalate), poly(butylene terephthalate), poly(ethylene naphthalate), nylon-6, nylon-66, polypropylene, polymethylpentene, poly(vinyl chloride), polyacrylate, polymethacrylate, polyimides, polyetherimides, polyarylates, polysulfones, polyethersulphones, poly(phenylene ethers), polycarbonates, ABS resins, and the like can be used as the material of base layer 110. To increase the mechanical strength of base layer 110, it is preferable to use poly(ethylene terephthalate), nylon-6, or nylon-66 as the material for base layer 110.

To increase the mechanical strength of cover tape 100, it is preferable to use a uniaxially- or biaxially-oriented film as base layer 110. The thickness of base layer 110 is preferably 12 µm or greater and 30 µm or less, further preferably 16 µm or greater and 28 µm or less, and particularly preferably 20 µm or greater and 25 µm or less.

When the thickness of base layer 110 is less than 30 µm, the rigidity of cover tape 100 will not be too high. For this reason, when twisting stress is applied to carrier tape 300 after heat-sealing, cover tape 100 can conform to the deformations of carrier tape 300. As a result, it becomes difficult to delaminate cover tape 100 from carrier tape 300 easily.

In addition, when the base layer 110 is thicker than 12 µm, cover tape 100 will have satisfactory mechanical strength. For these reasons, is will be difficult to rupture cover tape 100 when it is rapidly delaminated from carrier tape 300 during removal of the later mentioned surface mount electronic components (referred to below as electronic parts) 400 stored in electronic parts package 200.

<Adhesive Layer>

Adhesive layer 120 has an adhesive resin and an antistatic agent. The antistatic agent contains an alkylene carbonate and a surfactant as the primary components. The antistatic agent is preferably contained in an amount that makes up 10 wt % or more and 70 wt % or less of adhesive layer 120, and in particular it is more preferably contained as 20 wt % or more and 70 wt % or less, and furthermore it is further preferably contained as 30 wt % or more and 70 wt % or less, and furthermore it is still further preferably contained as 40 wt % or more and 70 wt % or less, and furthermore it is still further preferably contained as 45 wt % or more and 70 wt % or less. As the method for forming adhesive layer 120, without being limiting in any particular way, the method of formation by coating is preferred from the perspectives of ease of processability and low costs.

(1) Adhesive Resin

For the adhesive resin, commonly known resins can be used as film adhesives for bonding adherends such as films and the like. Moreover, adhesive resins are frequently treated with solvents, and anything added to the solvent must be nonaqueous.

Adhesive layer 120 is introduced between base layer 110 that is an oriented film and cushion layer 130. For this reason, adhesive layer 120 is introduced as an adhesive resin for an anchor coating. Furthermore, when adhesive layer 120 is introduced between an oriented film and an oriented film, adhesive layer 120 is introduced as an adhesive resin for dry lamination.

In the case of a one-component type adhesive resin, concrete examples of the material of the adhesive resin that can be named include esters, ethers, and the like, but from consideration of the transparency of adhesive layer 120 ester type of the cured urethane-isocyanate-type adhesives are preferred.

In the case of a two-component type adhesive resin, examples of the main components of the adhesive resin that can be named include esters or ethers, but esters are preferred. Examples of curing agents for the adhesive resin that can be named include aromatics and aliphatics, and in particular aliphatics are preferred because of the absence of yellowing after curing. Concrete examples of the main components of the adhesive resin that can be named include polyester compositions such as polyester polyols or polyether polyols, which are combined with isocyanate compounds, or the like. When the adhesive resin is a mixture of a polyester composition and an isocyanate compound, a surfactant and an alkylene carbonate can optionally be added to the mixture of polyester composition and isocyanate compound, but from a consideration of the stability of the reaction conditions, the preferred method is to add these to some of the resin beforehand.

(2) Alkylene Carbonate

Since alkylene carbonates have high boiling points and high dielectric constants, they also do not volatilize even after the dry lamination step curing by heating, and surfactants remain in the dissolved state. Since the alkylene carbonate that remains in the liquid state functions as an ionic liquid electrolyte, cover tape 100 can suppress electrostatic charge without the need for atmospheric moisture or the like. For this reason, cover tape 100 can suppress electrostatic charge in a low-humidity environment. Specifically, examples of alkylene carbonates that can be named include ethylene carbonate, propylene carbonate, butylene carbonate, and the like, and propylene carbonate is particularly preferred.

The weight ratio of alkylene carbonate and surfactant (alkylene carbonate/surfactant) was preferably 10/90 or more and 40/60 or less. When the weight ratio of the alkylene carbonate and surfactant is less than 10/90, adhesive layer 120 will have inadequate adhesive strength. When the weight ratio of the alkylene carbonate and surfactant exceeds 40/60, the surfactant will be an inadequate medium for preventing electrostatic charge, which will decrease the electrostatic charge prevention effect of cover tape 100. If the weight ratio of the alkylene carbonate and surfactant is within the range specified above, adhesive layer 120 will both have adhesiveness and will be difficult to take on electrostatic charge.

(3) Surfactant

Since ionic conductivity can occur with surfactants, which themselves utilize moisture and the like, they can contribute antistatic capability to added material. For this reason, surfactants can increase the antistatic properties of adhesive layer 120. Additionally, surfactants can increase the antistatic properties of the adherents to adhesive layer 120, which are base layer 110 and cushion layer 130.

The surfactant used can be a commonly known surfactant, but it is preferable if it is soluble in alkylene carbonate and if it is transparent. From the perspectives of transparency, antistatic properties and cost, these surfactant materials are preferably cationic antistatic agent non-aqueous ionic liquid electrolytes or the like, and particularly preferable from the perspective of antistatic properties are alkyl quaternary ammonium ethosulfates.

For adhesive layer 120 with the abovementioned alkylene carbonate and surfactant as the main components, the surface resistivity (measurement method: JIS K 6911) is $10^{12}$ Ω/square or less. When adhesive layer 120 has a surface resistivity of $10^{12}$ Ω/square or less, the electrical conductivity will be sufficient. For this reason, adhesive layer 120 will exhibit the capability of preventing the electrostatic induction mentioned below, and it will be more difficult for the cover tape to become electrically charged. Consequently, this cover tape 100 can diminish problems such as electrostatic discharge and pick-up defects.

The environment of the production step for delaminating cover tape 100 has arid conditions during the winter months.

Since the surface resistivity of adhesive layer 120 is maintained at $10^8$ Ω/square or greater and $10^{12}$ Ω/square or less in the reduced humidity of arid conditions, this can reduce the problems due to static electricity.

Thus, with electrostatic induction, an opposite charge is generated when a charged body approaches an object. When the opposite charge is generated, electric flux lines are produced between the charged body and the object. These electric flux lines are one of the factors in the generation of static electricity. If a good dielectric is introduced between the charged body and the object, opposing electric flux lines are generated within the good dielectric. These electric flux lines within the good dielectric will cancel the electric flux lines between the charged body and the object and can suppress the generation of static electricity.

However, this effect of preventing electrostatic induction is proportional to the dielectric strength of the good dielectric, and the lower the dielectric strength of the good dielectric (high surface resistivity value), the weaker the effect of preventing electrostatic induction, and the longer the time period needed for cancelation (electrostatic attenuation time). With today's advances in rapid implementation in the demonstration of a high electrostatic induction prevention effect, when heat-sealing layer 140 is charged by the application of 5 kV to its surface, an attenuation time of 10 s or less is necessary for the electrostatic voltage from the charging to diminish to 1%. Thus, with adhesive layer 120 having a surface resistivity of $10^{12}$ Ω/square or less, the attenuation time can be 10 s or less.

<Cushion Layer>

Cushion layer 130 comprises at least 1 layer, and plays a cushioning role when cover tape 100 is sealed to carrier tape 300. Moreover, cushion layer 130 plays a role in accomplishing various delamination mechanisms when delaminating cover tape 100 from carrier tape 300. For example, in the case of the transfer and delamination mechanism, cushion layer 130 includes a layer that takes into consideration compatibility with adhesive layer 120. In the case of the cohesive failure delamination mechanism, cushion layer 130 includes a layer that fails to cohere to the layer adjoining adhesive layer 120. In the case of the interfacial delamination mechanism, cushion layer 130 can be a single layer, but multiple layers are more effective at imparting slipperiness to cover tape 100.

As the material of cushion layer 130 in the case of the transfer and delamination mechanism, an olefinic material is used for ready transfer to adhesive layer 120 and as a low-cost material. In addition, polyethylene materials are preferred as the material of cushion layer 130 from the cushioning characteristics perspective, and low-density polyethylene is particularly preferable from the perspective of low-temperature sealability.

As the material of cushion layer 130 in the case of the cohesive failure delamination mechanism, polyethylene and olefinic materials are used due to the need for cushioning characteristics. Additionally, so that cover tape 100 will readily undergo rupture, the material of cushion layer 130 is preferably polyethylene and olefinic materials admixed with poorly compatible accessory components. Examples of poorly compatible accessory components that can be used include styrenic materials, for example polystyrene, polystyrene/acrylate, and the like.

In the case of the interfacial delamination mechanism, since cushioning characteristics and adhesiveness between cushion layer 130 and adhesive layer 120 are required, styrenic materials can be used for cushion layer 130. From the perspective of heat transfer during heat sealing, the thickness of cushion layer 130 is preferably 5 µm or greater and 50 µm or less. Examples of manufacturing methods for cushion layer 130 that can be named include the dry lamination method, co-extrusion method, and extrusion lamination method, which are inexpensive methods that are easy to implement.

<Heat-Sealing Layer>

Heat-sealing layer 140 is disposed as the outermost layer of cover tape 100. Heat-sealing layer 140 is formed by adding an antistatic agent to acrylic resin or polyester resin. The amount of antistatic agent added is adjusted so that the surface resistivity of heat-sealing layer 140 is $10^4$ Ω/square or greater and $10^{10}$ Ω/square or less at 23° C. and 15% RH. Within the range in which the object of the present invention is not impaired, the antistatic agent used can be any selected from among metallic fillers such as tin oxides, zinc oxides, titanium oxides, carbon and the like, and among surfactants such as polyoxyethylene alkylamines, quaternary ammoniums, alkyl sulfonates, and the like, either singly or in mixtures. Carbon includes various forms of carbon fillers such as carbon black, white carbon, carbon fibers, carbon tubes, and the like. To prevent blocking, it is satisfactory to add to the abovementioned formulations any one from among oxide particles in which any of silicon, magnesium, or calcium are the main ingredient, for example, silica, talc, and the like, or polyethylene particles, polyacrylate particles, polystyrene particles, or alloys thereof. Gravure coating methods are desirable as the method for forming heat-sealing layer 140.

If the surface resistivity of heat-sealing layer 140 is less than $10^4$ Ω/square, the resistance is too low during the generation of electric charge in the external portion when cover tape 100 is sealed to carrier tape 300, and there is considered to be a risk of occurrence of discharge phenomena when close to a charged body. Conversely, if the surface resistivity of heat-sealing layer 140 exceeds $10^{10}$ Ω/square and the static charge diffusion capability is inadequate, the target antistatic capability will not be exhibited and the cover tape will ultimately become charged, which will cause problems.

<Electronic Parts Package>

As shown in FIGS. 2, 3, electronic parts package 200 is constituted from cover tape 100 and carrier tape 300. This electronic parts package 200, as shown in FIGS. 2, 3, encloses an electronic part 400 in its interior, and electronic part 400 is stored and shipped in the state of being taken up on reel 500. Electronic part 400 can, for example, in addition to being an IC, can also be a transistor, diode, condenser, piezoelectric resistor, or the like. So that this electronic part 400 is not damaged during storage or shipping, it is protected by being enclosed in electronic parts package 200.

When electronic part 400 in electronic parts package 200 is packaged and shipped, electronic part 400 becomes charged due to friction between electronic part 400 and cover tape 100. However, when adhesive layer 120, which has the effect of preventing electrostatic induction, is inserted into cover tape 100, this acts to suppress electrostatic induction phenomena from electrostatically charged electronic part 400 to cover tape 100.

WORKING EXAMPLES

Working Examples 1-10 and Comparative Examples 1-7 relating to the present invention are explained below. Furthermore, the present invention is not limited in any way by these working examples.

Working Example 1

A cationic surfactant (trade name: Elegan 264-WAX, NOF Corp.) was dissolved in propylene carbonate to prepare an antistatic agent. The surfactant was added to the adhesive to make up 42 wt % of adhesive layer 120, and propylene carbonate was added to the adhesive to make up 28 M % of adhesive layer 120. The antistatic agent was mixed with a polyurethane composition (trade name: Takerak A-520, Mitsui Chemical) and an isocyanate composition (trade name: Takenate A-10, Mitsui Chemical) using a propeller stirrer to manufacture the adhesive. The polyurethane composition and isocyanate composition of the adhesive resin was added to the adhesive to make up 30 wt % of adhesive layer 120.

A biaxially-oriented polyester film (trade name: FE2021, Futamura Chemical) with a thickness of 25 μm was used as base layer 110. The adhesive was applied to base layer 110 to create adhesive layer 120 with a thickness of 1 μm. Cushion layer 130 was created by forming a film of thickness 25 μm by extruding low-density polyethylene (trade name: Sumikasen L-705, Sumitomo Chemical) onto adhesive layer 120 using a extrusion lamination method (drying oven temperature: 80° C.; line speed: 150 m/min).

Heat seal layer 140 was created by forming a film of thickness 1 μm with an acrylic resin (trade name: Corponiel 7980, Nippon Synthetic Chemical Industry Co.) using a gravure coating method to obtain cover tape 100 of which the coating thickness was adjusted to 2.5 g/m$^2$ (see FIG. 1). Furthermore, adhesive layer 120 included an antistatic agent that comprised a surfactant and propylene carbonate to make up 70 wt % of adhesive layer 120. In addition, the weight ratio of the alkylene carbonate and surfactant (alkylene carbonate/surfactant) was 40/60.

<Measurement of Lamination Strength>

The lamination strength of cover tape 100 was measured by delaminating cover tape 100 from electronic parts package 200. A lamination strength of 0.20 N or greater was acceptable, while a lamination strength of less than 0.20 N was not acceptable.

<Surface Resistivity>

The measurement of surface resistivity values was made using a SIMCO surface resistivity tester at 23° C., 20% RH, and the surface resistivity measurement was carried out on adhesive layer 120 of cover tape 100. Surface resistivity values that are 10$^8$ Ω/square or greater and 10$^{12}$ Ω/square or lower are acceptable, and values outside this range are not acceptable.

<Static Attenuation Time>

Under conditions where no antistatic treatment has been applied to either side, when an electrostatic charge of 5 kV was applied heat seal layer 140, the time until the voltage on cover tape 100 from the charge was attenuated to 1% was measured, and this was carried out using an EST electrostatic attenuation tester. Furthermore, measurements of the respective attenuation times were carried out both under conditions of 23° C. and 20% RH, and of 23° C. and 50% RH. An attenuation time of 10 s or less was acceptable, while an attenuation time that exceeds 10 s was not acceptable.

<Friction-Charged Electrostatic Potential>

Figure 4:
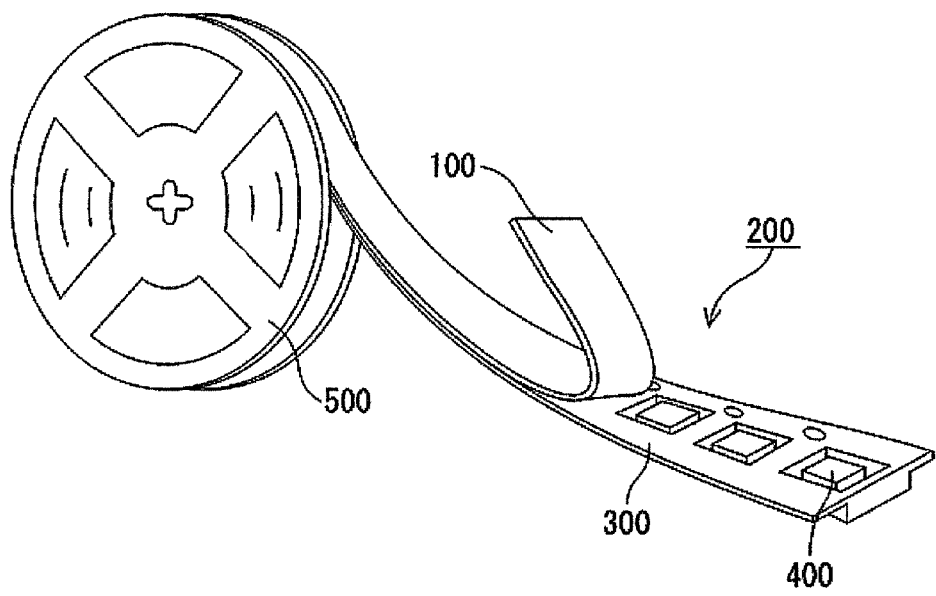
FIG. 4 is a perspective diagram that shows the delamination conditions for the cover tape for packaging electronic parts from the electronic parts package.

Under conditions where no antistatic treatment has been applied to either side of cover tape 100, it was delaminated from carrier tape 300 at a peel rate of 300 mm/min (see FIG. 4; test conditions: compliant with JIS C0806-3). Next, determination of the electrostatic charge generated in heat seal layer 140 of cover tape 100 was carried out using a TREK surface electrometer with a sample-probe separation of 1 mm. Furthermore, measurements of the respective charges were carried out both under conditions of 23° C. and 20% RH, and of 23° C. and 50% RH. An absolute value for the charge of 50 V or less was acceptable, while an absolute value for the charge that exceeded 50 V was not acceptable.

<Dissolution of the Antistatic Agent>

Figure 5:
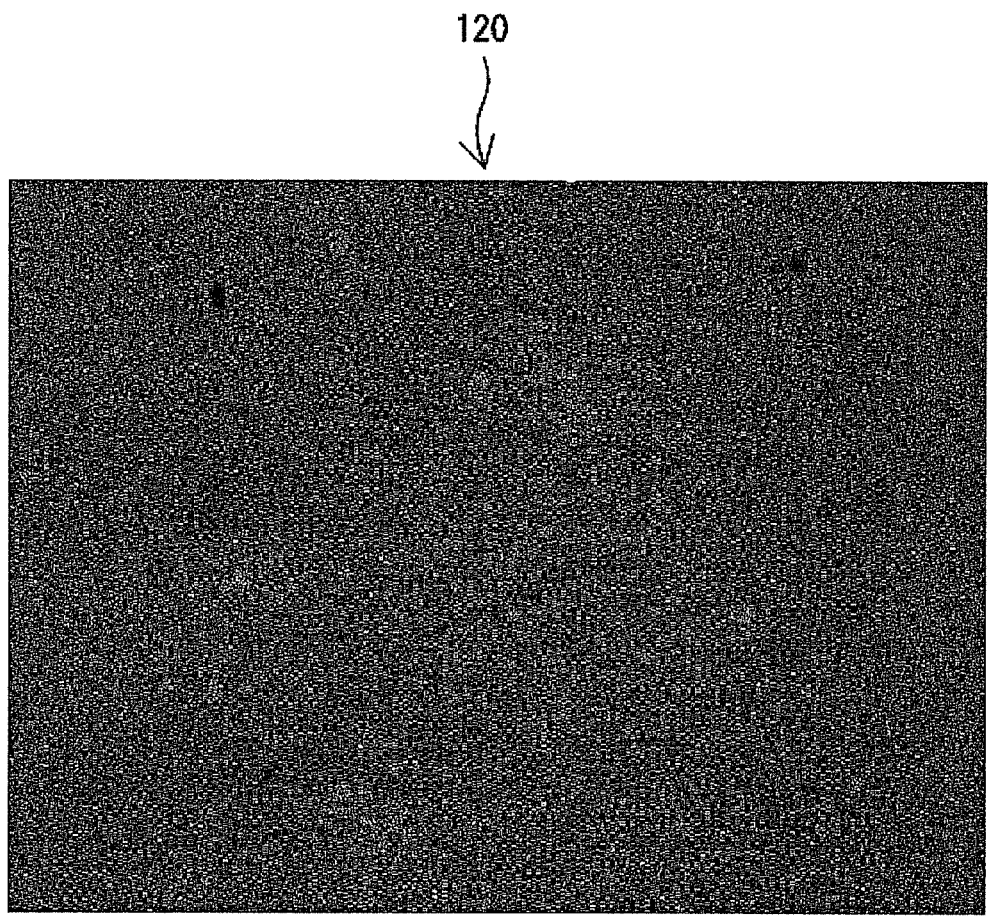
FIG. 5 is an example of a polarized optical microscope image of the adhesive layer under conditions in which an antistatic agent is dissolved.
Figure 6:
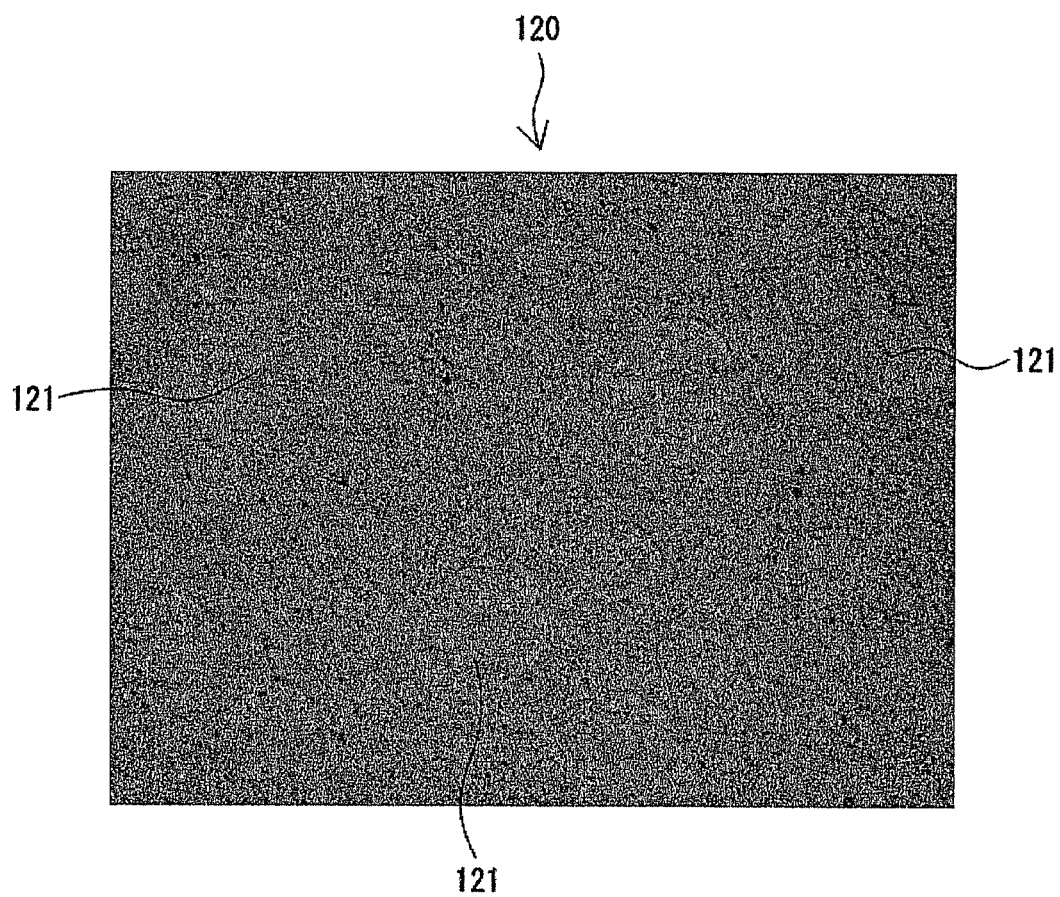
FIG. 6 is an example of a polarized optical microscope image of the adhesive layer under conditions in which an antistatic agent is saturated and is partially not dissolved.

Observations of adhesive layer 120 were carried out with a polarized optical microscope, which was used to confirm whether or not the antistatic agent had dissolved in the adhesive resin. FIG. 5 shows the state of adhesive layer 120 when the antistatic agent had dissolved, and FIG. 6 shows the state of adhesive layer 120 when the antistatic agent had not dissolved.

Results—lamination strength: 0.22 N; surface resistivity: 1.0×10$^9$ Ω/square; static attenuation time (23° C. and 20% RH): 0.02 sec.; static attenuation time (23° C. and 50% RH): 0.02 sec.; friction-charged electrostatic potential (23° C. and 20% RH): 15 V; friction-charged electrostatic potential (23° C. and 50% RH): 13 V; and, there was no undissolved antistatic agent (see Table 1 below).

Working Example 2

Cover tape 100 was obtained in the same manner as for Working Example 1, except that the coating thickness was adjusted to 5.0 g/m$^2$. Additionally, measurements and validations were carried out for each of the parameters in the same manner as for Working Example 1.

Results—lamination strength: 0.24 N; surface resistivity: 8.0×10$^8$ Ω/square; static attenuation time (23° C. and 20% RH): 0.05 sec.; static attenuation time (23° C. and 50% RH): 0.04 sec.; friction-charged electrostatic potential (23° C. and 20% RH): 10 V; friction-charged electrostatic potential (23° C. and 50% RH): 8 V; and, there was no undissolved antistatic agent (see Table 1 below).

Working Example 3

Cover tape 100 was obtained in the same manner as for Working Example 1, except that the surfactant made up 27 wt % of adhesive layer 120, the propylene carbonate made up 18 wt % of adhesive layer 120, and the adhesive resin made up 55 wt % of adhesive layer 120. Furthermore, adhesive layer 120 included an antistatic agent that comprised a surfactant and propylene carbonate to make up 45 wt % of adhesive layer 120. Additionally, measurements and validations were carried out for each of the parameters in the same manner as for Working Example 1.

Results—lamination strength: 0.21 N; surface resistivity: 8.2×10$^9$ Ω/square; static attenuation time (23° C. and 20% RH): 0.12 sec.; static attenuation time (23° C. and 50% RH): 0.10 sec.; friction-charged electrostatic potential (23° C. and 20% RH): 8 V; friction-charged electrostatic potential (23° C. and 50% RH): 9 V; and, there was no undissolved antistatic agent (see Table 1 below).

Working Example 4

Cover tape 100 was obtained in the same manner as for Working Example 1, except that the surfactant made up 40 wt % of adhesive layer 120, the propylene carbonate made up 5 wt % of adhesive layer 120, and the adhesive resin made up 55% of adhesive layer 120. Furthermore, adhesive layer 120 included an antistatic agent that comprised a surfactant and propylene carbonate to make up 45 wt % of adhesive layer 120. In addition, the weight ratio of the alkylene carbonate and surfactant (alkylene carbonate/surfactant) was 11/89. Additionally, measurements and validations were carried out for each of the parameters in the same manner as for Working Example 1.

Results—lamination strength: 0.23 N; surface resistivity: 5.3×10$^9$ Ω/square; static attenuation time (23° C. and 20%

RH): 0.10 sec.; static attenuation time (23° C. and 50% RH): 0.10 sec.; friction-charged electrostatic potential (23° C. and 20% RH): 6 V; friction-charged electrostatic potential (23° C. and 50% RH): 6 V; and, there was no undissolved antistatic agent (see Table 1 below).

Working Example 5

Cover tape 100 was obtained in the same manner as for Working Example 1, except that the surfactant made up 63 wt % of adhesive layer 120, the propylene carbonate made up 7 wt % of adhesive layer 120, and the adhesive resin made up 30 wt % of adhesive layer 120. In addition, the weight ratio of the alkylene carbonate and surfactant (alkylene carbonate/surfactant) was 10/90. Additionally, measurements and validations were carried out for each of the parameters in the same manner as for Working Example 1.

Results—lamination strength: 0.25 N; surface resistivity: $5.5 \times 10^8$ Ω/square; static attenuation time (23° C. and 20% RH): 0.09 sec.; static attenuation time (23° C. and 50% RH): 0.10 sec.; friction-charged electrostatic potential (23° C. and 20% RH): 16 V; friction-charged electrostatic potential (23° C. and 50% RH): 15 V; and, there was no undissolved antistatic agent (see Table 1 below).

Working Example 6

Cover tape 100 was obtained in the same manner as for Working Example 1, except that the surfactant made up 6 wt % of adhesive layer 120, the propylene carbonate made up 4 wt % of adhesive layer 120, and the adhesive resin made up 90 wt % of adhesive layer 120. Furthermore, adhesive layer 120 included an antistatic agent that comprised a surfactant and propylene carbonate to make up 10 wt % of adhesive layer 120. Additionally, measurements and validations were carried out for each of the parameters in the same manner as for Working Example 1.

Results—lamination strength: 0.25 N; surface resistivity: $8.1 \times 10^{10}$ Ω/square; static attenuation time (23° C. and 20% RH): 0.82 sec.; static attenuation time (23° C. and 50% RH): 0.55 sec.; friction-charged electrostatic potential (23° C. and 20% RH): 19 V; friction-charged electrostatic potential (23° C. and 50% RH): 18 V; and, there was no undissolved antistatic agent (see Table 1 below).

Working Example 7

Cover tape 100 was obtained in the same manner as for Working Example 1, except that the surfactant made up 18 wt % of adhesive layer 120, the propylene carbonate made up 2 wt % of adhesive layer 120, and the adhesive resin made up 80 wt % of adhesive layer 120. Furthermore, adhesive layer 120 included an antistatic agent that comprised a surfactant and propylene carbonate to make up 20 wt % of adhesive layer 120. In addition, the weight ratio of the alkylene carbonate and surfactant (alkylene carbonate/surfactant) was 10/90. Additionally, measurements and validations were carried out for each of the parameters in the same manner as for Working Example 1, except that the lamination strength measurement was not carried out.

Results—surface resistivity: $1.3 \times 10^9$ Ω/square; static attenuation time (23° C. and 20% RH): 3.60 sec.; static attenuation time (23° C. and 50% RH): 0.33 sec.; friction-charged electrostatic potential (23° C. and 20% RH): 15 V; friction-charged electrostatic potential (23° C. and 50% RH): 13 V; and, there was no undissolved antistatic agent (see Table 1 below).

Working Example 8

Cover tape 100 was obtained in the same manner as for Working Example 1, except that the surfactant made up 8 wt % of adhesive layer 120, the propylene carbonate made up 2 wt % of adhesive layer 120, and the adhesive resin made up 90 wt % of adhesive layer 120. Furthermore, adhesive layer 120 included an antistatic agent that comprised a surfactant and propylene carbonate to make up 10 wt % of adhesive layer 120. In addition, the weight ratio of the alkylene carbonate and surfactant (alkylene carbonate/surfactant) was 20/80. Additionally, measurements and validations were carried out for each of the parameters in the same manner as for Working Example 1, except that the lamination strength measurement was not carried out.

Results—surface resistivity: $2.2 \times 10^9$ Ω/square; static attenuation time (23° C. and 20% RH): 4.50 sec.; static attenuation time (23° C. and 50% RH): 0.46 sec.; friction-charged electrostatic potential (23° C. and 20% RH): 29 V; friction-charged electrostatic potential (23° C. and 50% RH): 25 V; and, there was no undissolved antistatic agent (see Table 1 below).

Working Example 9

Cover tape 100 was obtained in the same manner as for Working Example 1, except that the surfactant made up 21 wt % of adhesive layer 120, the propylene carbonate made up 9 wt % of adhesive layer 120, and the adhesive resin made up 70 wt % of adhesive layer 120. Furthermore, adhesive, layer 120 included an antistatic agent that comprised a surfactant and propylene carbonate to make up 30 wt % of adhesive layer 120. In addition, the weight ratio of the alkylene carbonate and surfactant (alkylene carbonate/surfactant) was 30/70. Additionally, measurements and validations were carried out for each of the parameters in the same manner as for Working Example 1, except that the lamination strength measurement was not carried out.

Results—surface resistivity: $1.1 \times 10^9$ Ω/square; static attenuation time (23° C. and 20% RH): 3.50 sec.; static attenuation time (23° C. and 50% RH): 0.18 sec.; friction-charged electrostatic potential (23° C. and 20% RH): 2 V; friction-charged electrostatic potential (23° C. and 50% RH): 20 V; and, there was no undissolved antistatic agent (see Table 1 below).

Working Example 10

Cover tape 100 was obtained in the same manner as for Working Example 1, except that the surfactant made up 12 wt % of adhesive layer 120, the propylene carbonate made up 8 wt % of adhesive layer 120, and the adhesive resin made up 80 wt % of adhesive layer 120. Furthermore, adhesive layer 120 included an antistatic agent that comprised a surfactant and propylene carbonate to make up 20 wt % of adhesive layer 120. Additionally, measurements and validations were carried out for each of the parameters in the same manner as for Working Example 1, except that the lamination strength measurement was not carried out.

Results—surface resistivity: $4.0 \times 10^{10}$ Ω/square; static attenuation time (23° C. and 20% RH): 6.00 sec.; static attenuation time (23° C. and 50% RH): 0.12 sec.; friction-charged electrostatic potential (23° C. and 20% RH): 35 V; friction-charged electrostatic potential (23° C. and 50% RH): 20 V; and, there was no undissolved antistatic agent (see Table 1 below).

Comparative Example 1

A cover tape was obtained in the same manner as for Working Example 1, except that surfactant and propylene carbonate were not added, the adhesive resin made up 100 wt % of adhesive layer 120, and the coating thickness was adjusted to 1.5 g/m². Furthermore, adhesive layer 120 did not include an antistatic agent that comprised a surfactant and propylene carbonate. Additionally, measurements and validations for the cover tape obtained were carried out for each of the parameters in the same manner as for Working Example 1.

Results—lamination strength: 0.25 N; surface resistivity: greater than $1.0 \times 10^{12}$ Ω/square; static attenuation time (at 23° C. and 20% RH, and at 23° C. and 50% RH) could not be measured because the charge didn't attenuate; friction-charged electrostatic potential (23° C. and 20% RH): 100 V; friction-charged electrostatic potential (23° C. and 50% RH): 100 V; and, there was no undissolved antistatic agent (see Table 2 below).

Comparative Example 2

A cover tape was obtained in the same manner as for Working Example 1, except that the surfactant made up 33 wt % of adhesive layer 120, propylene carbonate was not added, the adhesive resin made up 67 wt % of adhesive layer 120, and the coating thickness was adjusted to 1.6 g/m². Furthermore, adhesive layer 120 included an antistatic agent that comprised a surfactant and propylene carbonate to make up 33.3 wt % of adhesive layer 120. Additionally, measurements and validations for the cover tape obtained were carried out for each of the parameters in the same manner as for Working Example 1.

Results—lamination strength: 0.20 N; surface resistivity: greater than $1.0 \times 10^{12}$ Ω/square; static attenuation times (at 23° C. and 20% RH, and at 23° C. and 50% RH) could not be measured because the charge didn't attenuate; friction-charged electrostatic potential (23° C. and 20% RH): 80 V; friction-charged electrostatic potential (23° C. and 50% RH): 83 V; and, there was no undissolved antistatic agent (see Table 2 below).

Comparative Example 3

A cover tape was obtained in the same manner as for Working Example 1, except that surfactant was not added, propylene carbonate made up 33.3 wt % of adhesive layer 120, the adhesive resin made up 67 wt % of adhesive layer 120, and the coating thickness was adjusted to 3.4 g/m². Furthermore, adhesive layer 120 included an antistatic agent that comprised a surfactant and propylene carbonate to make up 33.3 wt % of adhesive layer 120. Additionally, measurements and validations for the cover tape obtained were carried out for each of the parameters in the same manner as for Working Example 1.

Results—lamination strength: 0.15 N; surface resistivity: greater than $1.0 \times 10^{12}$ Ω/square; static attenuation times (at 23° C. and 20% RH, and at 23° C. and 50% RH) could not be measured because the charge didn't attenuate; friction-charged electrostatic potential (23° C. and 20% RH): 85 V; friction-charged electrostatic potential (23° C. and 50% RH): 87 V; and, there was undissolved antistatic agent (see Table 2 below).

Comparative Example 4

A cover tape was obtained in the same manner as for Working Example 1, except that the surfactant made up 80 wt % of adhesive layer 120, propylene carbonate made up 20 wt % of adhesive layer 120, adhesive resin was not added, and the coating thickness was adjusted to 1.6 g/m². Furthermore, adhesive layer 120 included an antistatic agent that comprised a surfactant and propylene carbonate to make up 100 wt % of adhesive layer 120. In addition, the weight ratio of the alkylene carbonate and surfactant (alkylene carbonate/surfactant) was 20/80. Additionally, measurements and validations for the cover tape obtained were carried out for each of the parameters in the same manner as for Working Example 1.

Results—lamination strength, static attenuation times (at 23° C. and 20% RH, and at 23° C. and 50% RH), and friction-charged electrostatic potential (23° C. and 20% RH) were not measured because the cover tape did not adhere to the carrier tape, surface resistivity: greater than $1.1 \times 10^{8}$ Ω/square; and, there was no undissolved antistatic agent (see Table 2 below).

Comparative Example 5

A cover tape was obtained in the same manner as for Working Example 1, except that the surfactant made up 0.5 wt % of adhesive layer 120, propylene carbonate made up 0.5 wt % of adhesive layer 120, adhesive resin made up 99 wt % of adhesive layer 120, and the coating thickness was adjusted to 2.5 g/m². Furthermore, adhesive layer 120 included an antistatic agent that comprised a surfactant and propylene carbonate to make up 1 wt % of adhesive layer 120. In addition, the weight ratio of the alkylene carbonate and surfactant (alkylene carbonate/surfactant) was 50/50. Additionally, measurements and validations for the cover tape obtained were carried out for each of the parameters in the same manner as for Working Example 1.

Results—lamination strength: 0.25 N; surface resistivity: greater than $1.0 \times 10^{12}$ Ω/square; static attenuation time (23° C. and 20% RH) and static attenuation time (23° C. and 50% RH) could not be measured because the charge didn't attenuate; friction-charged electrostatic potential (23° C. and 20% RH): 90 V; friction-charged electrostatic potential (23° C. and 50% RH): 89 V; and, there was no undissolved antistatic agent (see Table 2 below).

Comparative Example 6

A cover tape was obtained in the same manner as for Working Example 1, except that the surfactant made up 20 wt % of adhesive layer 120, propylene carbonate was not added, and the adhesive resin made up 80 wt % of adhesive layer 120. Furthermore, adhesive layer 120 included an antistatic agent that comprised a surfactant and propylene carbonate to make up 20 wt % of adhesive layer 120. Additionally, measurements and validations for the cover tape obtained were carried out for each of the parameters in the same manner as for Working Example 1.

Results—lamination strength: 0.25 N; surface resistivity: greater than $1.0 \times 10^{13}$ Ω/square; static attenuation time (23° C. and 20% RH) and static attenuation time (23° C. and 50% RH) could not be measured because the charge didn't attenuate; friction-charged electrostatic potential (23° C. and 20% RH): 70 V; friction-charged electrostatic potential (23° C. and 50% RH): 65 V; and, there was no undissolved antistatic agent (see Table 2 below).

Comparative Example 7

Cover tape 100 was obtained in the same manner as for Working Example 1, except that the surfactant made up 4 wt % of adhesive layer 120, the propylene carbonate made up 1 wt % of adhesive layer 120, and the adhesive resin made up 95 wt % of adhesive layer 120. Furthermore, adhesive layer 120 included an antistatic agent that comprised a surfactant and propylene carbonate to make up 5 wt % of adhesive layer 120. In addition, the weight ratio of the alkylene carbonate and surfactant (alkylene carbonate/surfactant) was 20/80. Additionally, measurements and validations for the cover tape obtained were carried out for each of the parameters in the same manner as for Working Example 1.

Results—lamination strength: 0.25 N; surface resistivity: greater than $1.0 \times 10^{11}$ Ω/square; static attenuation time (23° C. and 20% RH) and static attenuation time (23° C. and 50% RH) could not be measured because the charge didn't attenuate; friction-charged electrostatic potential (23° C. and 20% RH): 60 V; friction-charged electrostatic potential (23° C. and 50% RH): 20 V; and, there was no undissolved antistatic agent (see Table 2 below).

The evaluation results for the working examples are shown below in Table 1 and the evaluation results for the comparative examples are shown below in Table 2.

TABLE 1

| | Working Example 1 | Working Example 2 | Working Example 3 | Working Example 4 | Working Example 5 | Working Example 6 | Working Example 7 | Working Example 8 | Working Example 9 | Working Example 10 |
|---|---|---|---|---|---|---|---|---|---|---|
| Composition | | | | | | | | | | |
| Surfactant (wt %) | 42.0 | 42.0 | 27.0 | 40.0 | 63.0 | 6.0 | 18.0 | 8.0 | 21.0 | 12.0 |
| Alkylene carbonate (wt %) | 28.0 | 28.0 | 18.0 | 5.0 | 7.0 | 4.0 | 2.0 | 2.0 | 9.0 | 8.0 |
| Adhesive resin (wt %) | 30.0 | 30.0 | 55.0 | 55.0 | 30.0 | 90.0 | 80.0 | 90.0 | 70.0 | 80.0 |
| Antistatic agent (Surfactant + Alkylene carbonate) (wt %) | 70.0 | 70.0 | 45.0 | 45.0 | 70.0 | 10.0 | 20.0 | 10.0 | 30.0 | 20.0 |
| Alkylene carbonate/Surfactant | 40/60 | 40/60 | 40/60 | 11/89 | 10/90 | 40/60 | 10/90 | 20/80 | 30/70 | 40/60 |
| Coating thickness (g/m$^2$) | 2.5 | 5.0 | 2.5 | 2.5 | 2.5 | 2.5 | 2.5 | 2.5 | 2.5 | 2.5 |
| Evaluation result | | | | | | | | | | |
| Lamination strength (N) | 0.22 | 0.24 | 0.21 | 0.23 | 0.25 | 0.25 | — | — | — | — |
| Surface resistivity (Ω/□) 23° C.-20% RH | 1.0E+09 | 8.0E+08 | 8.2E+09 | 5.3E+09 | 5.5E+08 | 8.1E+10 | 1.3E+09 | 2.2E+09 | 1.1E+09 | 4.0E+10 |
| Static attenuation time (sec) 23° C.-20% RH | 0.02 | 0.05 | 0.12 | 0.10 | 0.09 | 0.82 | 3.60 | 4.50 | 3.50 | 6.00 |
| Static attenuation time (sec) 23° C.-50% RH | 0.02 | 0.04 | 0.10 | 0.10 | 0.10 | 0.55 | 0.33 | 0.46 | 0.18 | 0.12 |
| Friction-charged electrostatic potential (V) 23° C.-20% RH | 15 | 10 | 8 | 6 | 16 | 19 | 15 | 29 | 2 | 35 |
| Friction-charged electrostatic potential (V) 23° C.-50% RH | 13 | 8 | 9 | 6 | 15 | 18 | 13 | 25 | 20 | 20 |
| Undissolved antistatic agent | No | No | No | No | No | No | No | No | No | No |

TABLE 2

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Composition | | | | | | | |
| Surfactant (wt %) | 0.0 | 33.0 | 0.0 | 80.0 | 0.5 | 20.0 | 4.0 |
| Alkylene carbonate (wt %) | 0.0 | 0.0 | 33.0 | 20.0 | 0.5 | 0.0 | 1.0 |
| Adhesive resin (wt %) | 100.0 | 67.0 | 67.0 | 0.0 | 99.0 | 80.0 | 95.0 |
| Antistatic agent (Surfactant + Alkylene carbonate) (wt %) | 0.0 | 33.3 | 33.3 | 100.0 | 1.0 | 20.0 | 5.0 |
| Alkylene carbonate/Surfactant | 0/0 | 0/100 | 100/0 | 20/80 | 50/50 | 0/100 | 20/80 |
| Coating thickness (g/m$^2$) | 1.5 | 1.6 | 3.4 | 1.6 | 2.5 | 2.5 | 2.5 |
| Evaluation result | | | | | | | |
| Lamination strength (N) | 0.25 | 0.20 | 0.15 | Didn't adhere | 0.25 | 0.25 | 0.25 |
| Surface resistivity (Ω/□) 23° C.-20% RH | 1.0E+12< | 1.0E+12< | 1.0E+12< | 1.1E+08 | 1.0E+12< | 1.0E+13< | 1.0E+11 |
| Static attenuation time (sec) 23° C.-20% RH | Didn't attenuate | Didn't attenuate | Didn't attenuate | Didn't adhere | Didn't attenuate | Didn't attenuate | Didn't attenuate |
| Static attenuation time (sec) 23° C.-50% RH | Didn't attenuate | Didn't attenuate | Didn't attenuate | Didn't adhere | Didn't attenuate | Didn't attenuate | Didn't attenuate |
| Friction-charged electrostatic potential (V) 23° C.-20% RH | 100 | 80 | 85 | Didn't adhere | 90 | 70 | 60 |
| Friction-charged electrostatic potential (V) 23° C.-50% RH | 100 | 83 | 87 | Didn't adhere | 89 | 65 | 20 |
| Undissolved antistatic agent | No | No | Existed | No | No | No | No |

The results for the evaluation parameters were acceptable in all of Working Examples 1-10. In particular, compared to Working Examples 6-10 which contained adhesive layer 120 with less than 45 wt % of the antistatic agent, good results were obtained in Working Examples 1-5 which contained adhesive layer 120 with 45 wt % or more and 70 wt % or less of the antistatic agent. In addition, when the transparency of Working Examples 1-10 and Comparative Examples 1-7 was compared by visual inspection, Working Examples 1-10 had higher transparency compared to Comparative Examples 1-7.

On the other hand, the static attenuation effect was inadequate in Comparative Example 1 with no antistatic agent added to adhesive layer 120, Comparative Examples 2 and 6 with no added alkylene carbonate, Comparative Example 3 with no added surfactant, and Comparative Examples 5 and 7 with adhesive layer 120 that contained less than 10 wt % antistatic agent. Comparative Example 4 that did not contain adhesive resin had static attenuation effect and lamination strength that were inadequate.

<Effect in the Embodiment of the Present Invention>

From the above, as the result of diligently conducted research by the present inventors, it became clear that in cover tape 100 relating to the present embodiment, it will be more difficult for the cover tape to become electrically charged when an antistatic agent is added to the adhesive layer 120 in an amount to make up 10 wt % or more and 70 wt % or less of the adhesive layer 120. For this reason, cover tape 100 can prevent pick-up defects in electronic product 400, and can prevent damage to electronic product 400 due to electrostatic discharge.

Furthermore, the antistatic agent has an alkylene carbonate and a surfactant as the main components, and contains no or essentially no conductive substances such as metal or carbon materials that are factors that decrease the transparency of cover tape 100. Therefore, cover tape 100 has superior transparency.

Consequently, it is difficult for cover tape 100 to become electrically charged, and it has superior transparency.

Moreover, in the present embodiment, as the result of diligently conducted research by the present inventors, it became clear that by adding an antistatic agent to adhesive layer 120 in an amount to make up 45 wt % or more and 70 wt % or less of said adhesive layer 120, it is difficult for cover tape 100 to become electrically charged. For this reason, cover tape 100 can prevent pick-up defects in electronic product 400, and can prevent damage to electronic product 400 due to electrostatic discharge.

In addition, when cover tape 100 is heat-sealed onto carrier tape 300, the cushion layer plays a cushioning role to apply heat and pressure uniformly to cover tape 100 and carrier tape 300, and. In this way, cover tape 100 can be reliably heat-sealed to the carrier tape 300.

Additionally, in the present embodiment, since it is easy to provide adhesive layer 120 between base layer 110 and the cushion layer, it is not necessary to provide additional adhesive layers between other the layers. For this reason, the manufacturing costs of cover tape 100 can be reduced.

Moreover, in the present embodiment, a surfactant that is an ionic surfactant has excellent ionic conductivity. For this reason, it is difficult for cover tape 100 to become electrically charged.

In addition, in the present embodiment, the ionic surfactant that is a cationic surfactant dissolves readily in alkylene carbonate. The alkylene carbonate solution of the cationic surfactant is transparent. Therefore, cover tape 100 has superior transparency. Furthermore, it is difficult for cover tape 100 to become electrically charged. Additionally, since an inexpensive cationic surfactant is used, the manufacturing costs for cover tape 100 can be reduced.

Moreover, in the present embodiment, the cationic surfactant is an alkyl quaternary ammonium ethosulfate. For this reason, it is difficult for cover tape 100 to become electrically charged.

In addition, in the present embodiment, as the result of diligently conducted research by the present inventors, it became clear that by using propylene carbonate as the alkylene carbonate, it is difficult for cover tape 100 to become electrically charged. For this reason, cover tape 100 can prevent pick-up defects in electronic products, and can prevent damage to electronic products 400 due to electrostatic discharge.

Additionally, in the present embodiment, the weight ratio of the alkylene carbonate and surfactant (alkylene carbonate/surfactant) is 10/90 or greater and 40/60 or less. For this reason, the surfactant is present in the dissolved state in the alkylene carbonate. When the weight ratio of the alkylene carbonate and surfactant is less than 10/90, adhesive layer 120 will have inadequate adhesive strength. When the weight ratio of the alkylene carbonate and surfactant exceeds 40/60, the surfactant will be an inadequate medium for preventing electrostatic charge, which will decrease the electrostatic charge prevention effect of cover tape 100. Consequently, if the weight ratio of the alkylene carbonate and surfactant (alkylene carbonate/surfactant) is within the range specified above, adhesive layer 120 will have adhesiveness and will be unlikely to become electrically charged.

Moreover, in the present embodiment, the surface resistivity of the adhesive layer 120 is $10^8$ Ω/square to $10^{12}$ Ω/square. For this reason, these cover tapes 100 have high electrical conductivity at low RH compared to conventional cover tapes 100. Consequently, it is difficult for cover tape 100 to become electrically charged at low humidity.

In addition, in the present embodiment, cover tape 100 can cause the static voltage to decay over a short period of time. For this reason, it is more difficult for cover tape 100 to become electrically charged.

Additionally, in the present embodiment, these cover tapes 100 can lower the static voltage generated when there is friction with electronic part 400 compared to conventional cover tapes 100. Consequently, it is difficult for cover tape 100 to become electrically charged.

Usually, if the antistatic agent is not dissolved and rises to the surface, the adhesive strength of the adhesive layer will be diminished. However, in the present embodiment, an antistatic agent having no adhesive capability is present in the dissolved state in an adhesive resin. Consequently, adhesive layer 120 has superior adhesive strength.

Moreover, in the present embodiment, base layer 110 comprises a uniaxially- or biaxially-oriented film. For this reason, this base layer 110 can give greater mechanical strength to the cover tape 100 compared to base layers 110 that comprise a non-oriented film.

In addition, in the present embodiment, the thickness of base layer 110 is 12 μm or greater and 30 μm or less. For this reason, cover tape 100 will have satisfactory rigidity. Consequently, when twisting stress is applied to carrier tape 300 after heat-sealing, cover tape 100 can conform to the deformations of carrier tape 300 and can be prevented from delaminating from carrier tape 300. Furthermore, cover tape 100 has satisfactory mechanical strength. For this reason, cover tape 100 can resist rupture when rapidly delaminated from carrier tape 300.

Additionally, the above-described cover tape 100 is provided in the present embodiment. For this reason, electronic products package 200 can prevent pick-up defects in an electronic product, and can prevent damage to electronic products 400 due to electrostatic discharge.

Moreover, cover tape 100 of electronic products package 200 relating to the present embodiment can readily be delaminated from, carrier tape 300, and can prevent the loss of electronic product 400 from electronic product package 200. In this way, cover tape 100 relating to the present embodiment can prevent electrostatic charge.

Alternative Embodiments (A)
An antistatic treatment can optionally be applied to both sides or one side of cover tape 100. This antistatic treatment will make it more difficult for cover tape 100 to become electrically charged.
(B)
Base layer 110 can optionally be constituted from 2 or more laminated bodies. In addition, a non-oriented film can optionally be used as base layer 110.
(C)
Optionally, adhesive layer 120 is not provided between base layer 110 and cushion layer 130, and is provided between two other layers.
(D)
Depending on the type of electronic product 400, a resin having different antistatic characteristics can optionally be added to heat-sealing layer 140 to suppress frictional electrostatic characteristics between cover tape 100 and electronic product 400.

Preferred embodiments of the present invention are as described above, but the present invention is not limited in any way thereby. It is understood that other embodiments are possible without departing from the spirit and scope of the present invention. Furthermore, the action and effect of the constitution of the present invention are expressed in the present embodiments, but such actions and effects are examples and do not limit the present invention.

INDUSTRIAL APPLICABILITY

The cover tape relating to the present invention, together with a carrier tape, protects electronic parts from contamination during their storage, transport, and installation. The cover tape relating to the present invention, in particular, is carefully constituted for the static electricity that develops during delamination and from friction, and is suitable for use as a cover tape during the packaging with carrier tape of devices that are sensitive to static electricity, of which there is a recent increasing trend.

The invention claimed is:

1. Cover tape for packaging electronic parts, wherein the cover tape comprising a plurality of layers including at least a base layer and a heat-sealing layer, with at least two layers of the plurality of layers being laminated with an adhesive layer interposed, the adhesive layer containing an antistatic agent with an alkylene carbonate and a surfactant as the main components thereof in an amount that makes up 45 wt % or more and 70 wt % or less of the total amount of the adhesive layer.

2. The cover tape for packaging electronic parts as recited in claim 1, wherein the plurality of layers includes a cushion layer provided in between the base layer and the heat-sealing layer.

3. The cover tape for packaging electronic parts as recited in claim 2, wherein the base layer and the heat-sealing layer are laminated with the adhesive layer interposed.

4. The cover tape for packaging electronic parts as recited in claim 1, wherein the surfactant is an ionic surfactant.

5. The cover tape for packaging electronic parts as recited in claim 4, wherein the ionic surfactant is a cationic surfactant.

6. The cover tape for packaging electronic parts as recited in claim 5, wherein the cationic surfactant is an alkyl quaternary ammonium ethosulfate.

7. The cover tape for packaging electronic parts as recited in claim 1, wherein the alkylene carbonate is propylene carbonate.

8. The cover tape for packaging electronic parts as recited in claim 1, wherein the weight ratio of the alkylene carbonate to the surfactant is 10/90 or greater and 40/60 or less.

9. The cover tape for packaging electronic parts as recited in claim 1, wherein the surface resistivity measured by a JIS K 6911 method of the adhesive layer at a relative humidity of 20% is $10^8$ Ω/square or greater and $10^{12}$ Ω/square or less.

10. The cover tape for packaging electronic parts as recited in claim 1, wherein under conditions where no antistatic treatment has been applied to either side, when the surface of the side that has been heat-sealed is charged by the application of 5 kV, the decay time until the static voltage drops to 1% is 10 seconds or less.

11. The cover tape for packaging electronic parts as recited in claim 1, wherein under conditions where no antistatic treatment has been applied to either side, when there is friction for 1 minute between the surface of the side that has been heat-sealed and an electronic part at a speed of 300 rpm, the absolute value of the static voltage associated with the surface of the heat-sealed side of the cover tape for packaging electronic parts is 50 V or less.

12. The cover tape for packaging electronic parts as recited in claim 1, wherein an antistatic treatment is applied to both surfaces or one surface.

13. The cover tape for packaging electronic parts as recited in claim 1, wherein the adhesive layer contains an adhesive resin, and the antistatic agent is dissolved in the adhesive resin.

14. The cover tape for packaging electronic parts as recited in claim 1, wherein the base layer comprises a uniaxially- or biaxially-oriented film.

15. The cover tape for packaging electronic parts as recited in claim 1, wherein the thickness of the base layer is 12 μm or greater and 30 μm or less.

16. A package for electronic parts comprising;
the cover tape for packaging electronic parts as recited in claim 1, and
a carrier tape for packaging electronic parts to which the cover tape for packaging electronic parts is heat-sealed.

17. A package for electronic parts as recited in claim 16, wherein under conditions where no antistatic treatment has been applied to either side of the cover tape for packaging electronic parts, when the cover tape for packaging electronic parts is delaminated from the carrier tape for packaging electronic parts at a peel rate of 300 mm/min tested under a condition of JIS C0806-3 standard the absolute value of the static voltage generated on the surface of the heat-sealed side of the cover tape for packaging electronic parts is 150 V or less.

18. Cover tape for packaging electronic parts comprising;
a plurality of layers that includes at least a base layer and a heat-sealing layer; and an adhesive layer bonding at least two layers of the plurality of layers and containing an antistatic agent that has an alkylene carbonate and a surfactant as the main components in an amount that makes up 45 wt % or more and 70 wt % or less of the total amount of the adhesive layer.

* * * * *